United States Patent
Sidiropoulos et al.

(10) Patent No.: US 7,012,330 B1
(45) Date of Patent: Mar. 14, 2006

(54) INTEGRATED CIRCUIT DEVICE HAVING I/O STRUCTURES WITH REDUCED INPUT LOSS

(75) Inventors: Stefanos Sidiropoulos, Palo Alto, CA (US); Joe-Anand Louis-Chandran, Sunnyvale, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/372,879

(22) Filed: Aug. 12, 1999

(51) Int. Cl.
*H01L 23/48* (2006.01)

(52) U.S. Cl. ...................... 257/693; 257/784

(58) Field of Classification Search ............. 257/693, 257/784, 760, 336, 334, 408, 203, 208, 360, 257/401, 690, 698, 737, 773, 776, 734, 739, 257/780; 438/222, 223, 227, 228, 617, 618, 438/666
See application file for complete search history.

(56) References Cited

U.S. PATENT DOCUMENTS

| 5,751,015 A | * | 5/1998 | Corbett et al. ............... 257/48 |
| 5,861,659 A | * | 1/1999 | Okabe ........................ 257/518 |
| 6,097,066 A | * | 8/2000 | Lee et al. .................... 257/355 |
| 6,329,694 B1 | * | 12/2001 | Lee et al. .................... 257/372 |

FOREIGN PATENT DOCUMENTS

JP           60000769 A     *    1/1985

OTHER PUBLICATIONS

Adel S. Sedra and Kenneth C. Smith, Microelectronic Circuits 1998, Oxford University Press, 4$^{th}$ Edition, pp. 358-359.*

"A Partial Design Analysis of The Samsung KM416H4031T-G10 4Mx16 Double Data Rate SDRAM", Semiconductor Insights Inc., Mar. 1999.

* cited by examiner

*Primary Examiner*—Hoai Pham
*Assistant Examiner*—Dana Farahani
(74) *Attorney, Agent, or Firm*—Vierra Magen Marcus Harmon & DeNiro LLP (57) ABSTRACT

The present invention is an input/output (I/O) structure for an integrated circuit device which increases the input signal energy transfer characteristic and allows for increased operating frequency of the device. The I/O structure includes a conductive region in a doped region below a semiconductor bond pad. The I/O structure also includes a tapped region coupled to a supply voltage. The I/O structure may also include an output driver transistor layout with a tapped source region to decrease a parasitic series resistance between a drain region and a source voltage.

22 Claims, 7 Drawing Sheets

INTEGRATED CIRCUIT DEVICE HAVING I/O STRUCTURES WITH REDUCED INPUT LOSS

BACKGROUND OF THE INVENTION

This invention relates to high speed integrated circuit devices and, in particular, to input/output (I/O) structures for integrated circuits, for example a semiconductor memory device, which allow increased operating frequency relative to conventional structures and have input signal energy transfer characteristics which are optimized to support high data transfer speeds.

Figure 1:
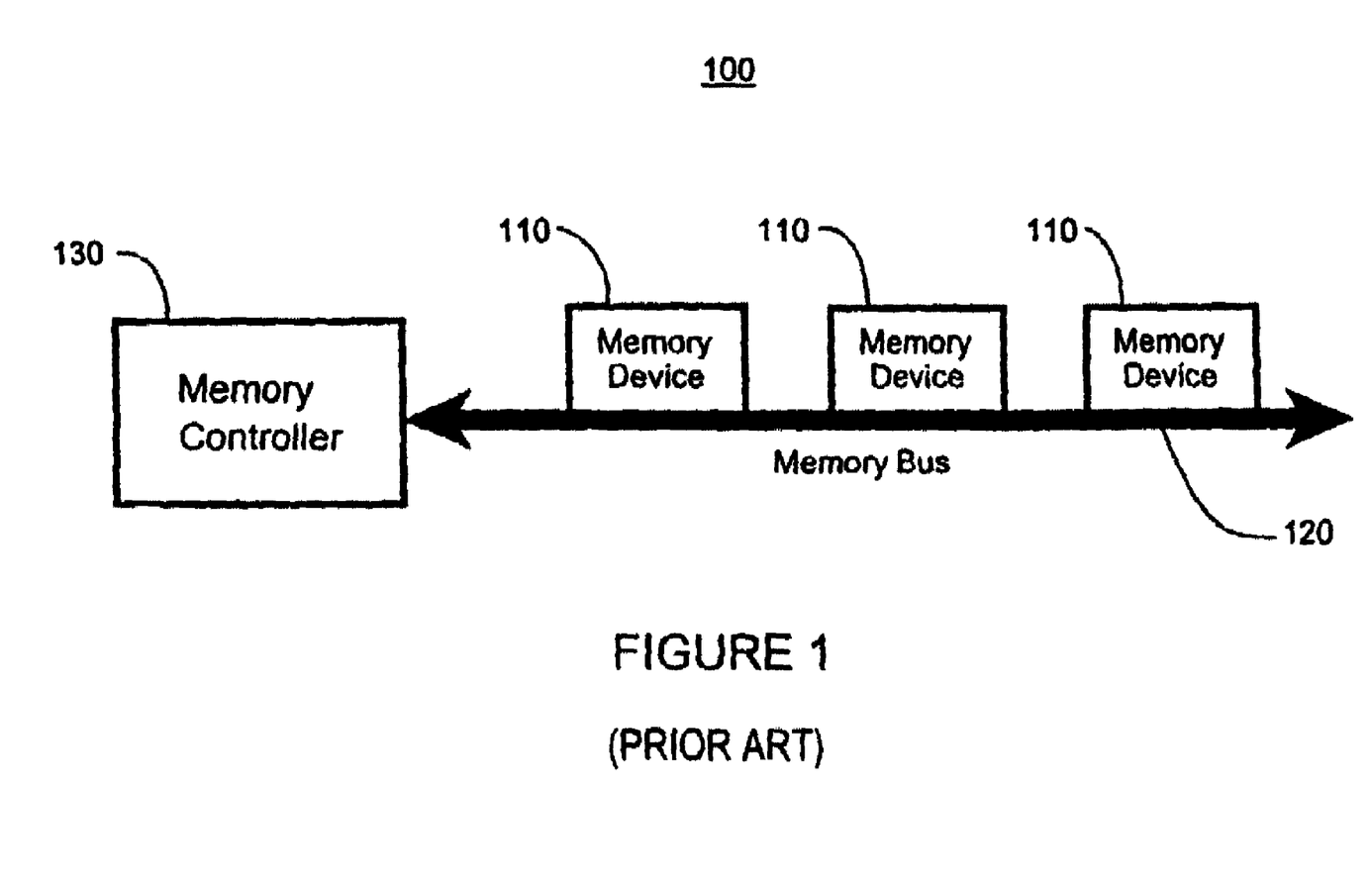
FIG. 1 is a schematic block diagram representation of a high speed memory bus having a number memory devices coupled to a memory controller.

Briefly, a semiconductor memory system includes a memory controller or processor, as well as one or more memory devices, such as a dynamic random access memory (DRAM) or static random access memory (SRAM), coupled to a bus. An example of such a system, is illustrated in FIG. 1 wherein memory system 100 includes a plurality of memory devices 110 coupled to a memory controller 130 via a high speed memory bus 120. The high speed memory bus 120 includes a number of signal lines which carry address, data and/or control information between the memory controller 130 and the memory devices 110.

There is a continuous demand for the system memory to provide data at a rate which does not unacceptably impact the operating speed of the microprocessor. Recently, microprocessor speeds have doubled on the average every two years. As microprocessor speeds increase, the speed of the memory bus must correspondingly increase to narrow a performance gap between memory controller 130 and the memory devices 110. Shortcomings currently exist which limit the speed at which the memory bus 120 may operate. In this regard, various parasitic losses on the signal line have a significant impact in limiting the bus for high speed operation. These parasitic losses may relate to physical layout features of, for example, the device packaging, the printed circuit board traces and the device I/O and circuit layouts. In fact, maximizing the performance of the signal line typically requires careful control, adjustment or reduction of all parasitic loss coupled to the bus in the memory system 100.

There are a number of factors which affect the speed of information transfer from the memory bus 120 through I/O circuitry of the memory devices 110. In this regard, as operating frequency of the memory bus 120 increases, the input loss characteristics of the memory device 110 tend to become a more significant factor. That is, as the operating frequency of the memory bus 120 increases, the energy transfer characteristic between the signal line of the memory bus 120 and the coupled memory device I/O structure tends to degrade. This degradation partially stems from the parasitic input resistance of the memory device 110. The equivalent parasitic input resistance of the memory device 110 tends to be dominated by the I/O layout structure of an I/O bond pad and I/O circuitry.

Figure 2A:
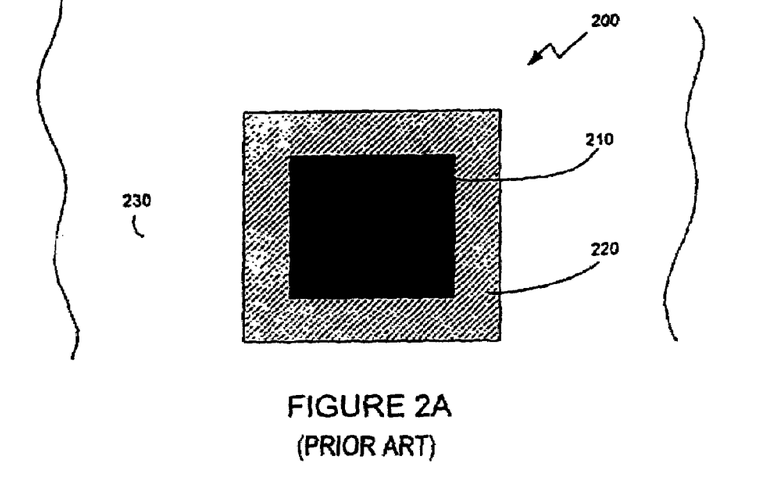
FIG. 2A is a diagram illustrating the layout of a conventional bond pad.
Figure 2B:
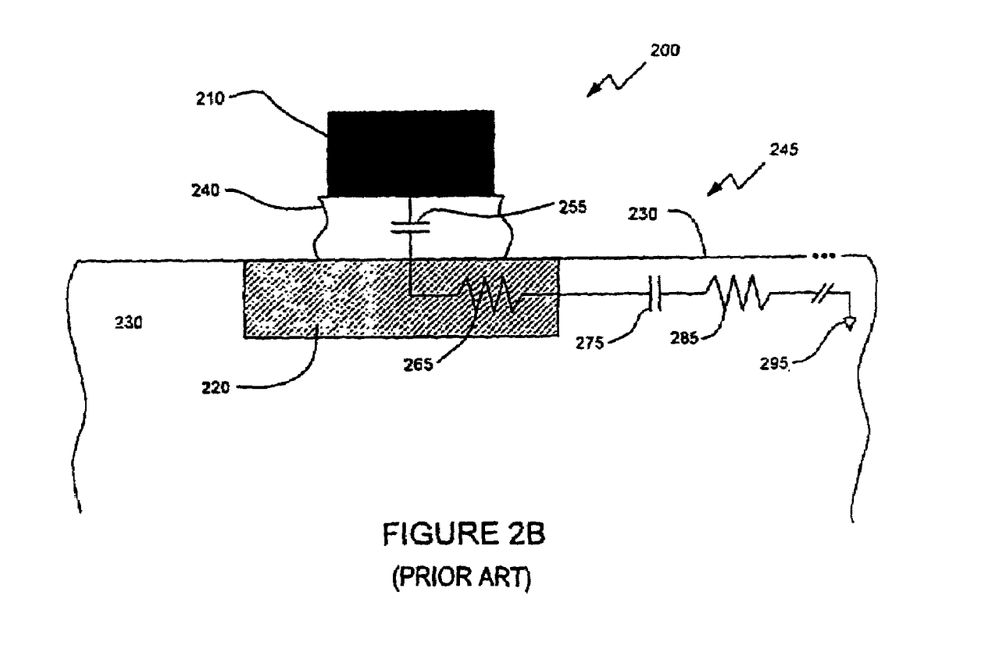
FIG. 2B is a cross-section of the bond pad of FIG. 2A and a schematic diagram illustrating a lumped circuit model of parasitic circuit elements of the conventional bond pad of FIG. 2A.

With reference to FIGS. 2A and 2B, a conventional bond pad 200 includes a conductive bond pad layer 210 and a doped region 220 both formed on a semiconductor substrate 230, for example a p-type substrate. A top view of a conventional bond pad 200 is illustrated in FIG. 2A. The bond pad 200 may be implemented on any of a number of integrated circuit devices, for example, a conventional semiconductor memory device. The bond pad 200 allows electrical coupling to an I/O pin (not shown) which, in turn, is coupled to the signal lines of the bus 120.

The conductive bond pad layer 210, formed on a semiconductor substrate 230, typically includes a metal layer, for example, aluminum. The conductive bond pad layer 210 is disposed above the doped region 220, for example, an n-doped region. An insulating layer 240 such as an oxide layer is disposed between the bond pad layer 210 and the doped region 220.

The doped region 220 typically includes an impurity region of opposite conductivity type than that of the substrate 230. This impurity region forms a PN junction with the substrate 230 to prevent or minimize the possibility of a short circuit between the bond pad layer 210 and the substrate 230.

With reference to FIG. 2B, a cross section of the conventional bond pad 200 of FIG. 2A and corresponding lumped equivalent circuit model 245 is illustrated. The lumped equivalent circuit model 245 is a parasitic series capacitance-resistance load which represents the bond pad 200. The lumped equivalent circuit model 245 is considered from the perspective of a corresponding signal line on the memory bus 120 of FIG. 1.

The lumped equivalent circuit model 245 includes a parasitic capacitance 255, a parasitic resistance 265, a parasitic junction capacitance 275, and a parasitic resistance 285. The parasitic capacitance 255 is representative of the capacitive effects due to the bond pad 210, insulating layer 240, and doped region 220 structure. As such, the parasitic capacitance 255 is coupled between a bond pad 210 and a doped region 220.

The parasitic resistance 265 is representative of the resistance inherent in the doped region 220. The parasitic resistance 265 is coupled in series with parasitic capacitance 255.

The parasitic junction capacitance 275 results from the PN junction which exists between the doped region 220 and the substrate 230. Here, the substrate 230 is of opposite conductivity to that of the doped region 220 and, as such, a capacitive effect develops between the doped region 220 and the substrate 230. The parasitic junction capacitance 275 is coupled in series with the parasitic resistance 265 of the doped region 220.

The parasitic resistance 285 represents the inherent resistance of substrate 230 with respect to the distant ground potential supply 295. As such, the parasitic resistance 285 is in series with the junction capacitance 275 and a distant ground potential supply 295.

With continued reference to FIG. 2B, the parasitic resistance 265 of the doped region 220 and the parasitic resistance 285 of the substrate 230 are primarily responsible for the high input loss characteristic of the device when operated at very high frequencies (for example, frequencies greater than 200 MHZ). In addition, these parasitic resistive effects may unacceptably attenuate a signal presented by the signal line which is coupled to the bond pad structure 200 in FIG. 2A.

Figure 3A:
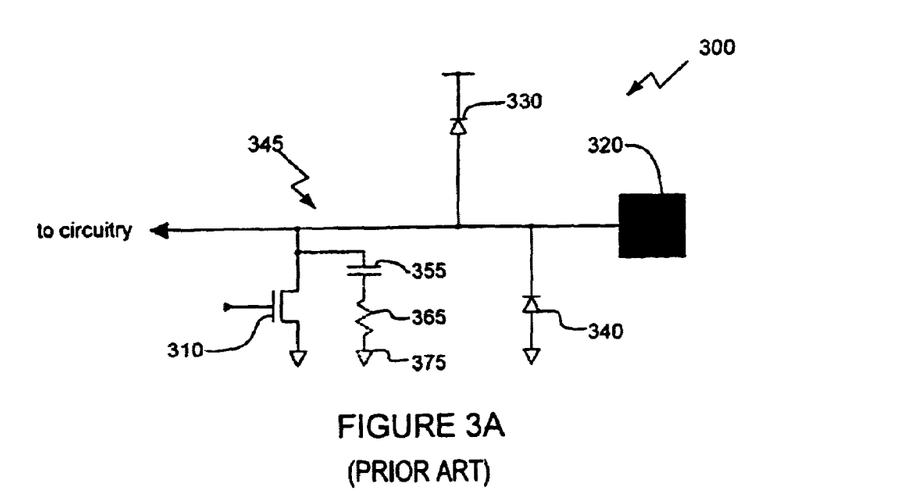
FIG. 3A is a schematic circuit diagram of a conventional bi-directional I/O circuit having an output driver transistor and a bond pad.
Figure 3B:
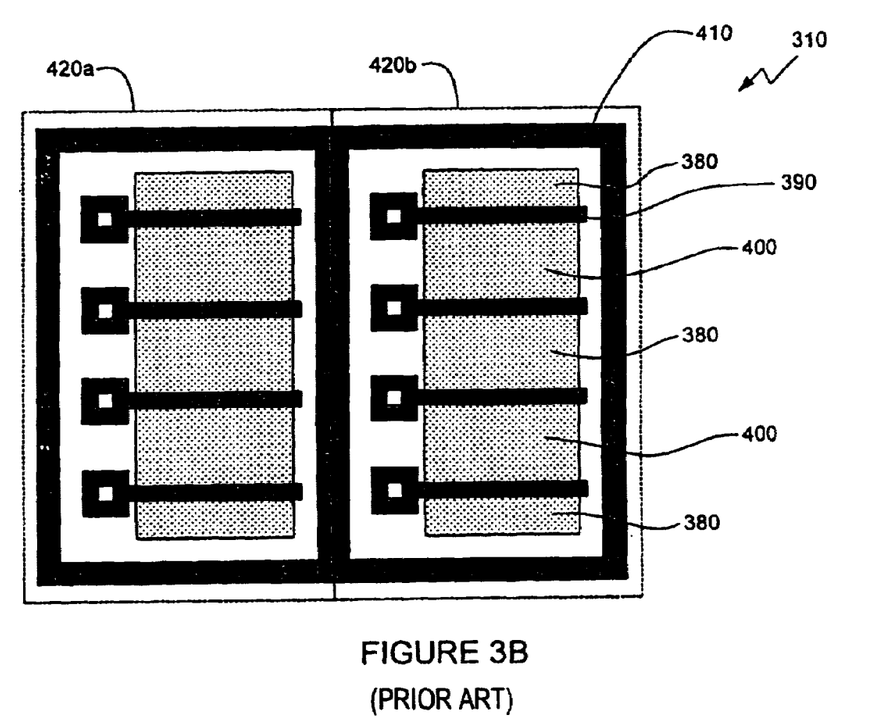
FIG. 3B is a diagram illustrating a conventional output driver transistor layout of FIG. 3A.

FIGS. 3A and 3B illustrate an output driver portion of a conventional bi-directional I/O circuit 300. The I/O circuit 300 includes an output driver transistor 310, having a drain coupled to a bonding pad 320. The bonding pad 320 is typically bonded, via a bond wire, to a pin residing external to the packaging of, for example, a semiconductor memory device. The I/O circuit 300 may also include electrostatic discharge (ESD) protection which is illustrated as a pair of reverse biased diodes 330 and 340.

The output driver transistor 310 introduces a parasitic capacitance 355 which is coupled in series with a parasitic resistance 365. The parasitic capacitance 355 and parasitic resistance 365 are both coupled in series between the drain electrode of transistor 310 and a ground potential supply 375.

The parasitic capacitance 355 is primarily due to an inherent PN junction between the drain electrode and the substrate. The parasitic resistance 365 is primarily due to the resistance in the substrate region between the drain regions 400 and tap region 410. These parasitic components, and primarily the parasitic resistance 365, tend to degrade performance of the conventional output driver transistor 310 by decreasing or limiting the signal energy transfer characteristic when operating at high frequencies (for example, greater than 200 MHZ).

It should be noted that the parasitic resistance 365 of the output driver 310 of FIG. 3B may be combined or "lumped" with parasitic resistance 285 observed in the bond pad structure 200 of FIG. 2B to establish an overall input loss characteristic of the I/O structure.

FIG. 3B illustrates a top view of the diffusion and polysilicon layers of a conventional transistor layout of the output driver transistor 310 of FIG. 3A. The transistor 310 includes source regions 380, gate electrodes 390, and drain regions 400. Interconnect layers (not shown), for example polysilicon or metal layers, couple common source regions, drain regions, and gate electrodes in parallel to complete the structure of output transistor 310. In addition, the interconnect layer may also couple a drain electrode of the transistor layout to the bond pad.

The transistor layout of FIG. 3B often includes a tap region 410. The tap region 410 is used to bias a well of the output transistor 310 to a supply voltage, for example, ground potential.

There is a need for an I/O structure for a semiconductor device which facilitates proper, efficient and effective operation at high frequencies when incorporated within a high speed bus based system. In this regard, there exists a need to control or limit parasitic losses in, for example, a memory system, and enhance the frequency response of the signal line.

There is a need to eliminate a high input loss of the integrated circuit device and to reduce the parasitic resistance of the doped region below the bond pad. In this regard, there is a need to reduce the parasitic series resistance between the bond pad, substrate region, and the supply voltage. This may enhance the input signal energy transfer characteristic for the integrated circuit device. In the context of memory systems, this will narrow the performance gap between a memory controller and the memory device.

Lastly, there is a need for an output driver and driver layout with decreased parasitic resistance between the drain region and the source voltage. By decreasing the parasitic resistances resulting from the output driver transistor and driver layout, manageability or control of the overall input loss characteristic is enhanced which thereby provides efficient and effective operation at high frequencies. Such reduced parasitic resistances in an output driver structure may enhance the operation of a memory device which is coupled to a high speed bus.

SUMMARY OF THE INVENTION

In a first principal aspect, the present invention is an input/output (I/O) structure of an integrated circuit device which provides an increased operating frequency and range to the device (for example, a memory device) as well as an increased input signal energy transfer characteristic when coupled to a high speed bus based system. The I/O structure of the present invention may include a conductive pad to receive an input signal from an external bus, a first doped region which underlies and at least partially surrounds the conductive pad, and a conductive region disposed or embedded in the first doped region to reduce the effective parasitic resistance in the first doped region. The I/O structure may also include a first tap region which is spaced apart from and at least partially surrounds a substantial portion of the first impurity region. The first tap region is electrically coupled and physically coupled (for example, by contact, doping, and/or structural integration) to a first supply voltage (for example, ground).

The I/O structure of the present invention may also include an output driver transistor having a drain region and a source region. The drain region may be electrically coupled to the conductive pad. A second tap region surrounds the output driver transistor and is electrically coupled to a second supply voltage (for example, ground) and electrically and physically coupled to the source region.

In another principal aspect, the present invention is a transistor layout which improves the input loss characteristic of an output driver transistor. In this aspect of the invention, the transistor layout provides for decreased parasitic resistance between a drain region and a source voltage. The transistor layout includes a source region, and a drain region. The drain region may be electrically coupled to the bond pad. The transistor layout also includes a conductive tap region spaced proximal to and surrounding the drain region, the conductive tap region is electrically and physically coupled to the source region. Further, the conductive tap region is electrically coupled to a supply voltage (for example, ground).

In yet another principal aspect, the present invention is a bond pad for an integrated circuit device. The bond pad may include a conductive bonding layer, a doped region underlying and surrounding the conductive bonding layer, and a conductive region disposed in the doped region. The conductive region may have a surface area which is substantially equal to the surface area of the conductive bonding layer.

The bond pad of this aspect of the invention also includes a conductive tap region which is spaced apart from and surrounds at least a portion of the doped region. The conductive tap layer is electrically coupled to a supply voltage (for example, ground).

In one embodiment, the conductive tap region is a continuous region and substantially surrounds the doped region in a concentric-like manner. In another embodiment, the conductive tap region is a discontinuous region and surrounds the doped region in a concentric-like manner.

In another embodiment, the doped region may have a first doping density of a first conductivity type, and the conductive region may have a second doping density of the same type wherein the first doping density is less than the second doping density.

BRIEF DESCRIPTION OF THE DRAWINGS

In the course of the detailed description to follow, reference will be made to the attached drawings, in which.

DETAILED DESCRIPTION

The present invention is an input/output (I/O) structure for an integrated circuit device which permits the device (for example, a memory device) to operate at substantially higher frequencies, and over a substantially greater frequency range, than devices employing conventional I/O structures. The I/O structures of the present invention optimize and/or improve the efficiency of an input signal energy transfer characteristic of the device. The I/O structure of the present invention allow the integrated circuit device to operate efficiently and effectively in a high speed bus environment. In this regard, the parasitic losses of the I/O structure of the present invention are significantly reduced and/or adjusted to tune the frequency response of the I/O structure to that of the signal line of the high speed bus.

The I/O structures of the present invention overcome the shortcomings of conventional I/O structures by reducing parasitic resistance elements related to various layout features. In particular, the I/O structures of the present invention exhibit a significantly reduced equivalent parasitic series resistance resulting from the doped region below the bond pad. In addition, the input losses of the I/O structure are significantly limited or minimized by reducing the parasitic series resistance component between a bond pad substrate region and a supply potential.

In another aspect, the present invention improves the input loss characteristic relating to an output driver transistor layout. The output driver transistor layout of the present invention exhibits decreased parasitic resistance between a drain region and a source voltage. Under these circumstances, the overall input loss characteristic of the I/O structure is enhanced which correspondingly provides efficient and effective operation at high frequencies. Such an I/O structure will allow the integrated circuit to operate effectively and efficiently when coupled to a high speed bus.

Figure 4A:
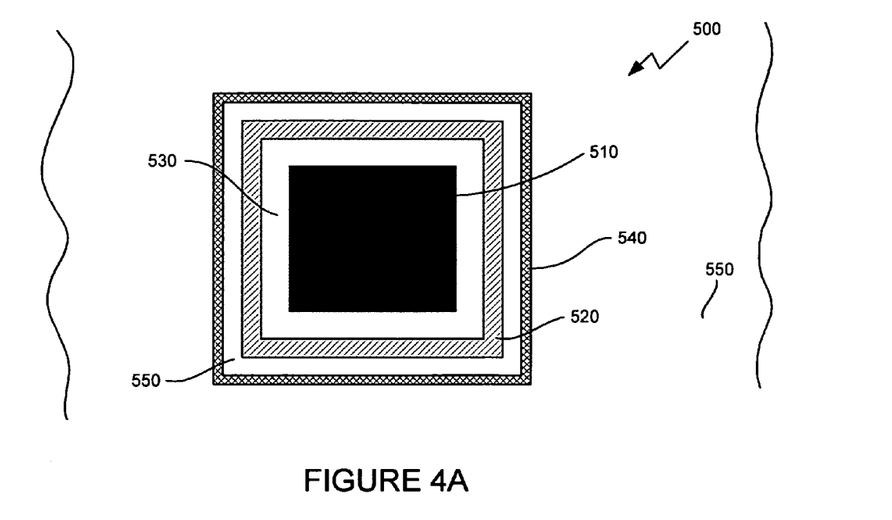
FIG. 4A is a diagram illustrating a bond pad layout according to one embodiment of the present invention.

With reference to FIG. 4A, a top view of a bonding pad 500 formed in accordance with one embodiment of the present invention is illustrated. The bonding pad layout 500 may be included on a variety of integrated circuit devices, for example, a semiconductor memory device, to allow electrical coupling to an I/O pin (not shown). The I/O pin may be coupled to a signal line of the high speed bus.

The bond pad 500 includes a conductive bond pad layer 510, doped region 520, for example, an n− doped region, a conductive region 530, and a tap region 540, all formed on or in a semiconductor substrate 550, for example a p-type material substrate. The bond pad layer 510 is disposed on the doped region 520. The bond pad layer 510 comprises a metal such as aluminum or gold, or other suitable conductive material, such as polysilicon. An insulating layer 560 (illustrated in FIG. 4B), such as oxide, is disposed between the bond pad layer 510 and the doped region 520.

The conductive region 530 is disposed, introduced or embedded in or on the doped region 520. In the illustrated embodiment, the conductive region 530 is disposed in the doped region 520 and beneath the bond pad layer 510. The conductive region 530 has a surface area which is substantially equal to the surface area of the bond pad layer 510.

The conductive region 530 may be implemented as an n− doped region in the doped region 520. The conductive region 530 may be more heavily doped than doped region 520 to reduce the per square resistance of region 530. Under these circumstances, the conductive region 530 decreases the parasitic resistance of the bond pad 500. That is, the conductive region 530 serves to reduce the parasitic input resistance of the bond pad 500 and, in particular, the resistance which is in series with the parasitic capacitance of the bond pad layer 510. The parasitic capacitance of the bond pad layer 510 of this embodiment of the present invention is substantially similar to the parasitic input capacitance of the conventional bonding pad (FIGS. 2A and 2B).

With continued reference to FIG. 4A, tap region 540 substantially surrounds and is spaced from the doped region 520. In a preferred embodiment, tap region 540 substantially surrounds the doped region 520 in a concentric-like manner. The tap region 540 is formed proximal to the doped region 520 to reduce the equivalent series resistance between the doped region 520 and the supply voltage 595. In a preferred embodiment, the tap region 540 is spaced from the doped region 520 by an amount which provides an equivalent parasitic input resistance of the bond pad 500 in the range of between five ohms and fifteen ohms. Under those circumstances, the input resistance of the bond pad 500 of the integrated circuit device provides more efficient signal energy transfer at high operating frequencies than bond pad structures of conventional devices.

In one embodiment, the tap region 540 may be a p+ type diffusion and is electrically connected to a supply voltage 595 (for example, ground).

Figure 4B:
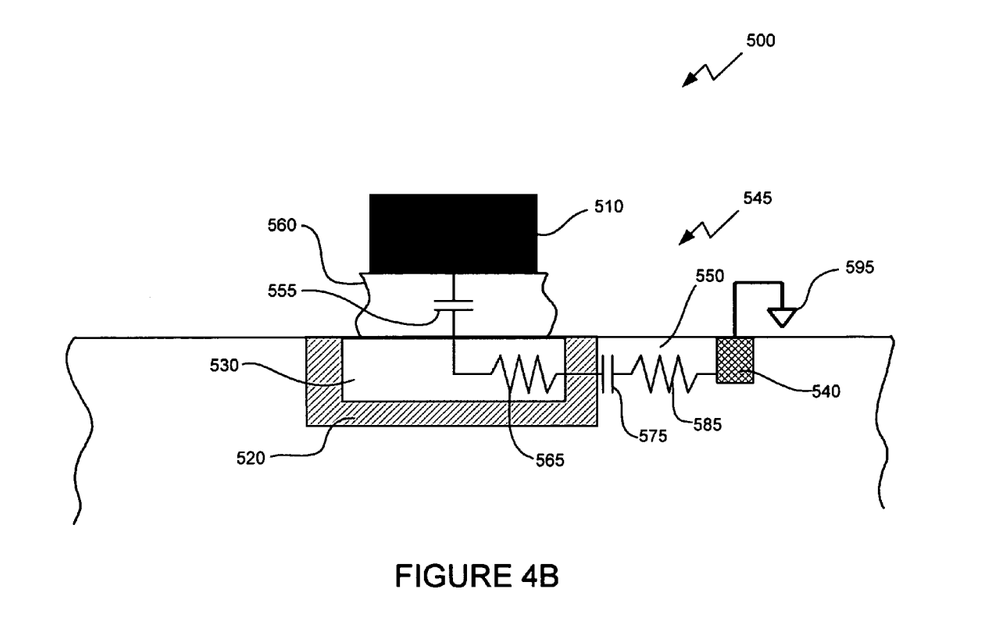
FIG. 4B is a cross-section of the bond pad of FIG. 4A and a schematic diagram illustrating a lumped circuit model of parasitic circuit elements in a bond pad layout according to the embodiment illustrated in FIG. 4A.

A lumped equivalent circuit model 545 which is representative of the parasitic electrical behavior of the bonding pad layout 500 of FIG. 4A is illustrated in FIG. 4B. The lumped equivalent circuit model 545 models the load which the bonding pad layout 500 presents to the corresponding signal line on the memory bus 120 of FIG. 1. The lumped equivalent circuit model 545 includes a parasitic capacitance 555, a parasitic resistance 565, a PN junction capacitance 575, and a parasitic resistance 585. When compared to the conventional structures, the bond pad 500 of the present invention exhibits significantly reduced parasitic resistances 565 and 585. Here, the parasitic resistance 565 is decreased significantly by including the conductive region 530 in the first doped region 520. The tap region 540 serves to reduce the parasitic resistance 885 by reducing the distance to the supply voltage 595.

The decreased equivalent input resistance of the present invention, relative to the conventional bond pad layout, serves to minimize and control the input loss and ensure optimal high frequency response in a semiconductor bus system having a controlled impedance bus.

Figure 4C:
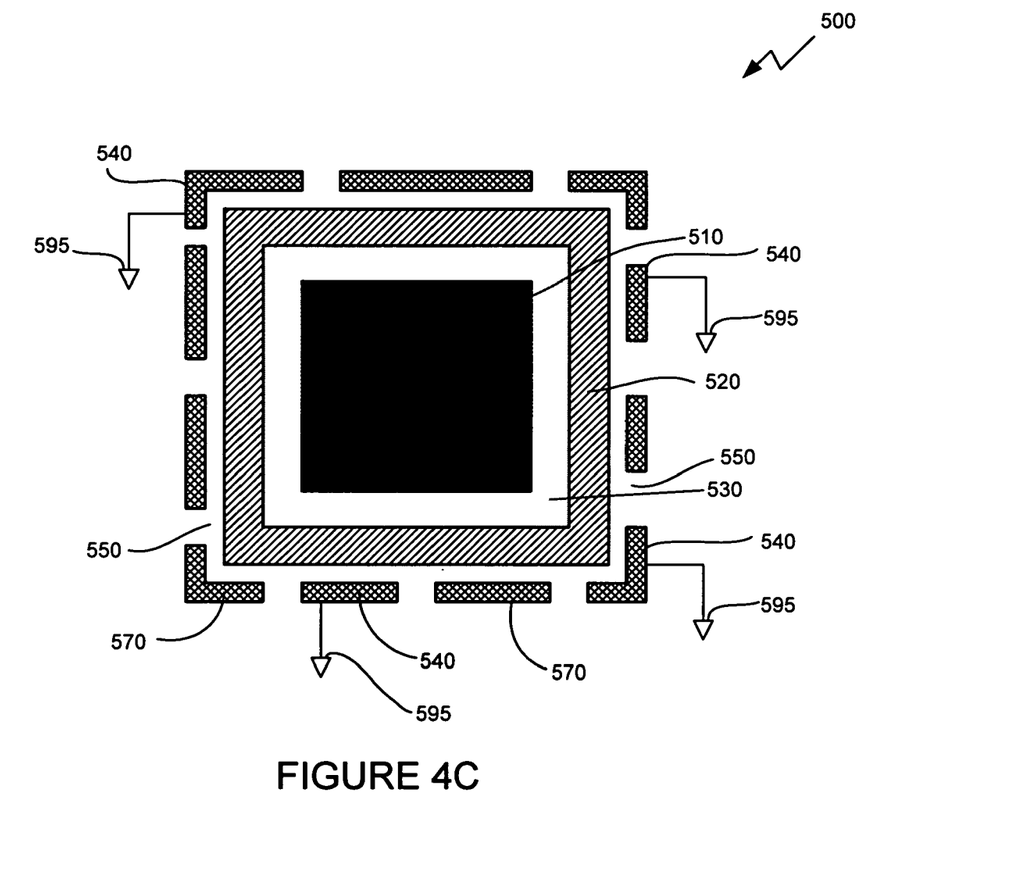
FIG. 4C is a diagram illustrating a bond pad layout according to another embodiment of the present invention.

It should be noted that the tap region 540 may be implemented using various designs or alterations in layout and configuration. With reference to FIG. 4C, the tap region 540 only partially surrounds the bond pad layer 510 and doped region 520. In a preferred embodiment, tap region 540 partially surrounds the doped region 520 in a concentric-like manner.

In addition, select portions of the tap region 540 may be decoupled from the supply voltage 595 using a mask option (not illustrated) to alter and/or tune the input loss characteristic of the I/O structure. That is, a conductive interconnect structure may be employed, as is well known in the art, to connect selective portions of the tap region 540 to the supply voltage 595 to change the parasitic input resistance component between the doped region 520 and the supply voltage 595 (for example, ground) coupled through the conductive tap region 540.

Furthermore, other tap regions 570 are not coupled to the supply voltage 595. By decoupling the areas of the tap region 540, from the supply voltage 595, the equivalent parasitic input resistance may be adjusted to fine tune the frequency response characteristic of the I/O structure and bond pad 500. Those skilled in the art will recognize that other layouts and configurations are possible and certain layouts and designs more suitable for particular frequency responses.

Figure 5A:
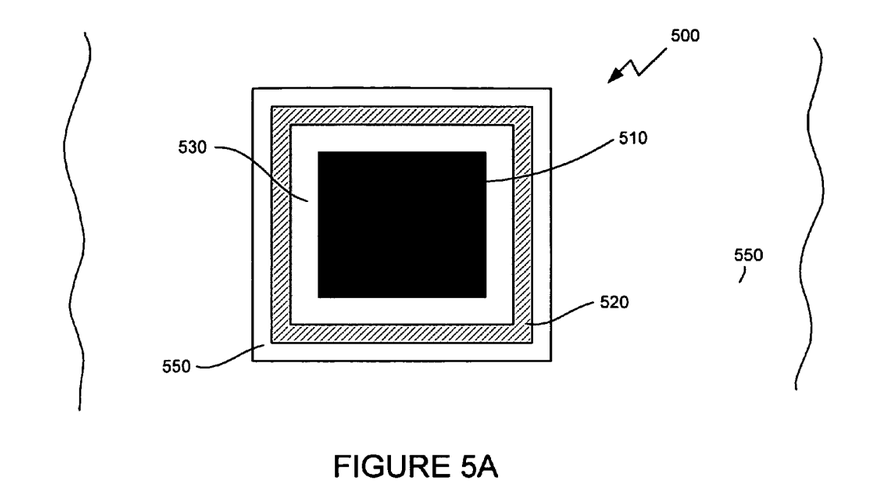
FIG. 5A is a diagram illustrating a bond pad layout according to another embodiment of the present invention.
Figure 5B:
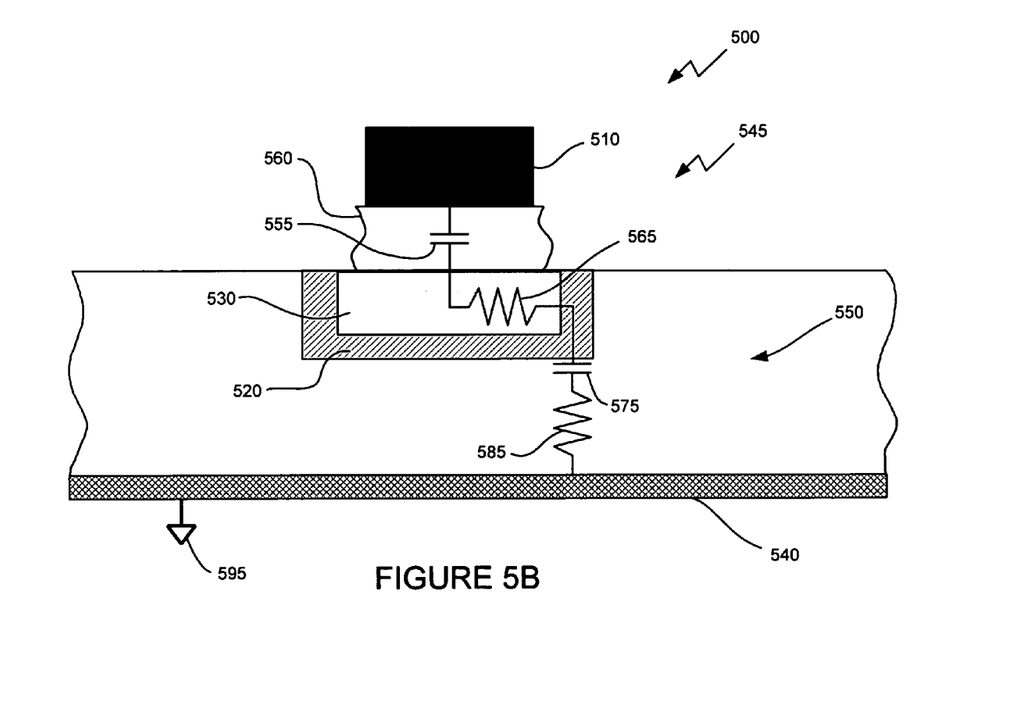
FIG. 5B is a cross-section of the bond pad of FIG. 5A and a schematic diagram illustrating a lumped circuit model of parasitic circuit elements in a bond pad layout according to the embodiment illustrated in FIG. 5A.

With reference to FIGS. 5A and 5B, in another embodiment of the present invention, the tap region 540 is formed underneath conductive region 530 as a buried layer. In this embodiment, the tap region 540 and the conductive region 530 are formed in the substrate as doped regions. The tap region 540 is connected to a supply voltage 595 (for example, a ground voltage). This embodiment may reduce the size of the die and, like the embodiment of FIGS. 4A and 4B, would minimize the parasitic resistance component between the conductive region 530 and the supply voltage 595.

It should be noted that the embodiment of FIGS. 5A and 5B may also be formed using a stacked structure wherein the tap region 540 is formed via polysilicon on the substrate 550. Under these circumstances, an epitaxial and/or insulating layer may be formed on the tap region 540 and the remaining aspects of the bond pad (for example, conductive region 530) are formed on or in the epitaxial layer.

The bond pad structure of the present invention, provides an input resistance which is reduced, minimized, controlled, trimmed and/or adjusted to provide an optimal frequency response when coupled to an external bus system. In one embodiment, an equivalent parasitic input resistance is specified to be in the range of between five ohms and fifteen ohms. Such a resistance provides an optimal frequency response up to a frequency of 1.2 GHz. Moreover, maximum capacity systems may achieve higher timing and voltage margins by setting the equivalent parasitic input resistance to less than ten ohms.

Figure 6:
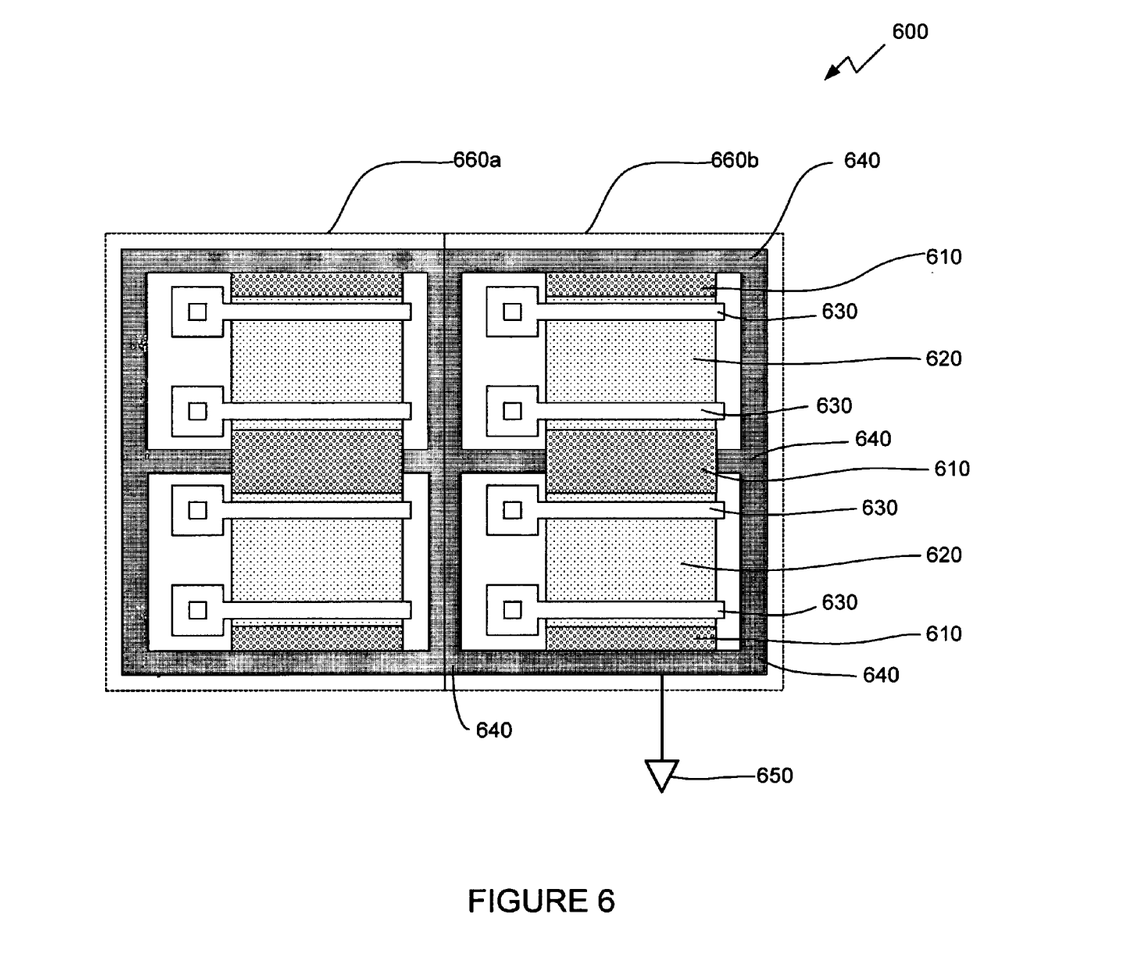
FIG. 6 is a diagram of an output driver transistor layout according to an embodiment of the present invention.

FIG. 6 illustrates a top view of a layout of the diffusion and polysilicon layers of an output driver transistor 600 according to one embodiment of the present invention. The output driver transistor 600 includes source regions 610, drain regions 620, gate electrodes 630, and conductive tap region 640. Interconnect layers (not shown), for example a polysilicon or metal layer, couple the source regions, drain regions, and gate electrodes in parallel to complete the transistor structure. The interconnect layers may also electrically couple the drain regions 620 of the transistor 600 to the bi-directional bond pad 500 (FIGS. 4 and 5) for coupling to an external signal line (for example, a signal line of the memory bus 120 of FIG. 1).

The conductive tap region 640 is employed to bias the well of the transistor 600 to a source voltage 650 (for example, a ground potential supply). Under those circumstances where the output driver transistor 600 is an NMOS type, the conductivity type of the conductive tap region 650 is a p+ type diffusion. In contrast, where the output driver transistor 600 is an PMOS type, the conductivity type of the conductive tap region 650 is a n+ type diffusion.

In one embodiment, the conductive tap region 640 is electrically coupled as well as physically coupled, for example, via contact and/or doping, to the source regions 610 of the output driver transistor 600. These regions may be physically coupled by structurally integrating the conductive tap region 640 with the source regions 610 as a homogeneous conductive region (i.e., tap region 640 integrated within source region 600, or vice versa). These configurations tend to reduce and/or minimize the effective parasitic resistance between the drain regions 620 and the source voltage 650 of the conductive tap region 640.

It should be noted that the conductive tap region 640 need not be electrically and physically coupled to all source regions 610 of the output driver transistor 600. Analogous to the tap region of the embodiment of FIG. 4C, the conductive tap region 640 of FIG. 6 may only partially surrounds the output driver transistor 600. Here, select portions of the tap region 640 may be decoupled from the supply voltage 650 using a mask option (not illustrated) to alter and tune the input loss characteristic of the output driver transistor 600. A conductive interconnect structure may be employed, as is well known in the art, to connect selective portions of the tap region 640 to the supply voltage 650 to change the parasitic resistance component between drain regions 620 and the source voltage 650 (for example, ground).

In another preferred embodiment, the conductive tap region 640 is spaced proximal to and substantially surrounds each of the drain regions 620 of the transistor 600. This tends to further reduce any effective series resistance between the drain regions 620 and the supply voltage 650.

It should also be noted that the conductive tap region 640 may be extended or included to surround and couple (electrically and physically) to other structures relating to the I/O of an integrated circuit device. For example, the conductive tap region 640 may be formed around input receiver circuitry to minimize parasitic resistance effects due to the input receiver circuitry layout. Indeed, a tap region biased to a supply voltage will significantly reduce any parasitic resistance coupling the input receiver structure and ground.

The output driver transistor 600 of FIG. 6 may include one or more transistor columns 660a and 660b. The layout of each column are mirror images of the other column and, in sum, form the output driver transistor 600.

In short, the present invention overcomes the shortcomings of the conventional bond pad structures by including a conductive region beneath a bond pad to reduce a related parasitic resistance element. Moreover, the shortcomings of the conventional bond pad structure are overcome by substantially surrounding the bond pad region with a conductive tap region. The conductive tap region is coupled to a supply voltage to reduce the corresponding parasitic series resistance residing in the doped region below a semiconductor bond pad. The conductive tap region may be mask optioned to finely tune or adjust the parasitic resistance and provide an optimal frequency response, for example, in a controlled impedance high speed bus.

The present invention overcomes the shortcomings relating to conventional transistor layout techniques by including a conductive tap region surrounding the drain region. The conductive tap region reduces the parasitic series resistance coupled between the drain region and a supply voltage. By providing the conductive tap region to the source region of the transistor layout, the parasitic series resistance between the supply voltage and the drain region is minimized. Moreover, the conductive tap region in this embodiment may also be optionally masked to tune the parasitic resistance and provide a desired frequency response.

While this invention has been particularly shown and described to the preferred embodiment thereof, various changes in form and detail may be made without departing from the spirit and scope of this invention. On the contrary, it is intended that various modifications within the spirit and scope of the appended claims are covered. For example, any metal interconnect structure which is coupled to an I/O bond pad has an associated capacitance to the substrate and therefore poses a parasitic resistance component. By placing a conductive tap region coupled to a supply voltage proximal to this metal interconnect structure, the parasitic resistance component is reduced.

The invention claimed is:

1. An integrated circuit device comprising:
   a bond pad structure including:
   a conductive pad;
   a first doped region of a first conductivity type disposed in a semiconductor substrate of a second conductivity type, wherein the first doped region is underlying and surrounding the conductive pad;
   a conductive region of the first conductivity type, underlying and surrounding the conductive pad, disposed in the first doped region;
   a first tap region spaced apart from and surrounding a substantial portion of the first doped region, wherein the first tap region is electrically coupled to a first supply voltage;
   an output driver transistor having a drain region and a source region, wherein the drain region is electrically coupled to the conductive pad; and
   a second tap region surrounding the output driver transistor, wherein the second tap region is electrically and physically coupled to a second supply voltage and the source region.

2. The integrated circuit device of claim 1 wherein the conductive pad includes a metal.

3. The integrated circuit device of claim 1 wherein the first tap region completely surrounds the first doped region, and wherein the first and second supply voltages are ground.

4. The integrated circuit device of claim 1 wherein the first tap region is a discontinuous region.

5. The integrated circuit device of claim 1 wherein a doping concentration of the first doped region is less than a doping concentration of the conductive region.

6. The integrated circuit device of claim 1 wherein the first tap region is a second doped region and the second tap region is a third doped region.

7. The integrated circuit device of claim 6 wherein the second doped region is of an opposite conductivity type than the first doped region.

8. The integrated circuit device of claim 6 wherein the third doped region is a P type doped region and the output driver transistor is an NMOS type transistor.

9. The integrated circuit device of claim 1 further including a tap region portion that is spaced apart from and surrounding the first doped region, wherein the tap region portion is decoupled from the first supply voltage to provide a predetermined resistance between the first doped region and the first supply voltage.

10. The integrated circuit device of claim 1 wherein a portion of the second tap region is integrated into the source region.

11. The integrated circuit device of claim 10 wherein the first tap region is a discontinuous region.

12. A bond pad for an integrated circuit device, the bond pad comprising:
    a conductive bonding layer;
    a doped region of a conductivity type formed in a semiconductor substrate of a second conductivity type, wherein the doped region is underlying and surrounding the conductive bonding layer;
    a conductive region of the first conductivity type disposed in the first doped region, wherein the conductive region is underlying and surrounding the conductive bonding layer and wherein the conductive region includes a surface area at least substantially equal to a surface area of the conductive bonding layer; and
    a conductive tap region spaced apart from and surrounding at least a portion of the first doped region, wherein a portion of the conductive tap region is electrically coupled to a supply voltage.

13. The bond pad of claim 12 wherein the supply voltage is a ground voltage and the conductive bonding layer includes a metal.

14. The bond pad of claim 12 wherein the doping concentration of the doped region is less than the doping concentration of the conductive region.

15. The bond pad of claim 12 wherein the conductive tap region is doped to be of an opposite conductivity type than the doped region.

16. The bond pad of claim 12 further including a conductive tap region portion that is spaced apart from and surrounding the doped region, wherein the conductive tap region portion is decoupled from the supply voltage to provide a predetermined resistance between the doped region and the supply voltage.

17. The bond pad of claim 12 wherein the conductive tap region is a continuous region.

18. The bond pad of claim 17 wherein the conductive tap region completely surrounds the doped region.

19. The bond pad of claim 12 wherein the conductive tap region is a discontinuous region.

20. The bond pad of claim 19 wherein the conductive tap region substantially surrounds the doped region in a concentric-like manner.

21. The bond pad of claim 12 wherein the conductive region is polysilicon.

22. The bond pad of claim 21 wherein the conductive tap region is a doped layer positioned beneath the conductive region.

* * * * *